US010529406B2

(12) United States Patent
Choi et al.

(10) Patent No.: US 10,529,406 B2
(45) Date of Patent: Jan. 7, 2020

(54) MEMORY DEVICE AND REFRESH METHOD THEREOF

(71) Applicant: SAMSUNG ELECTRONICS CO., LTD., Suwon-si, Gyeonggi-Do (KR)

(72) Inventors: Won Jun Choi, Yongin-si (KR); Hui Kap Yang, Hwaseong-si (KR)

(73) Assignee: SAMSUNG ELECTRONICS CO. LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 15/823,152

(22) Filed: Nov. 27, 2017

(65) Prior Publication Data
US 2018/0197599 A1 Jul. 12, 2018

(30) Foreign Application Priority Data
Jan. 9, 2017 (KR) .......................... 10-2017-0002981

(51) Int. Cl.
G11C 11/00 (2006.01)
G11C 11/406 (2006.01)
G11C 7/04 (2006.01)
G11C 14/00 (2006.01)
G11C 11/4078 (2006.01)

(52) U.S. Cl.
CPC .......... G11C 11/40626 (2013.01); G11C 7/04 (2013.01); G11C 11/406 (2013.01); G11C 11/4078 (2013.01); G11C 11/40611 (2013.01); G11C 11/40615 (2013.01); G11C 14/0009 (2013.01); G11C 2207/22 (2013.01)

(58) Field of Classification Search
CPC ................ G11C 11/40626; G11C 7/04; G11C 11/40615; G11C 11/4078; G11C 11/406; G11C 11/40611; G11C 14/0009; G11C 14/00
USPC .......................................... 711/103
See application file for complete search history.

(56) References Cited

U.S. PATENT DOCUMENTS

| 7,295,484 | B2 | 11/2007 | Cruz et al. |
| 7,742,355 | B2 * | 6/2010 | Kohler ............... G11C 11/406 |
| | | | 365/185.08 |
| 7,843,753 | B2 | 11/2010 | Mayer et al. |
| 8,218,137 | B2 | 7/2012 | Noh et al. |
| 8,659,959 | B2 | 2/2014 | Kim et al. |
| 8,982,653 | B2 | 3/2015 | Nurminen et al. |
| 9,129,702 | B2 * | 9/2015 | Kim ..................... G11C 11/406 |
| 9,368,187 | B2 * | 6/2016 | Dong ................ G11C 11/40618 |
| 2013/0242674 | A1 | 9/2013 | Furutani et al. |
| 2013/0301371 | A1 | 11/2013 | Chen |
| 2014/0068171 | A1 | 3/2014 | Lee |

(Continued)

Primary Examiner — Pierre Miche Bataille
(74) Attorney, Agent, or Firm — F. Chau & Associates, LLC

(57) ABSTRACT

A memory device includes a memory cell array that includes a plurality of memory cell rows, a temperature sensor that detects a temperature of the memory cell array and generates internal temperature data, a first register that stores external temperature data received from outside of the memory device, and a refresh control unit that determines a skip ratio of refresh commands received at a refresh frequency that corresponds to the external temperature data by comparing the internal temperature data and the external temperature data and performing a refresh operation for the plurality of memory cell rows in response to refresh commands skipped and transmitted based on the skip ratio.

19 Claims, 13 Drawing Sheets

(56) References Cited

U.S. PATENT DOCUMENTS

| | | | |
|---|---|---|---|
| 2015/0026537 A1* | 1/2015 | Romanovskyy | G11C 11/406 714/764 |
| 2015/0085594 A1 | 3/2015 | Dong et al. | |
| 2015/0206575 A1 | 7/2015 | Morgan | |
| 2015/0206757 A1* | 7/2015 | Han | H01L 21/02164 438/588 |
| 2015/0235694 A1 | 8/2015 | Kim et al. | |
| 2016/0225435 A1* | 8/2016 | Lee | G11C 11/40626 |
| 2017/0133085 A1* | 5/2017 | Kim | G06F 3/0619 |

\* cited by examiner

FIG. 11

| TEMP_R | Refresh Rate (based on TEMP_R) | Temperature (based on TEMP_R) | TEMP | Refresh Rate (based on TEMP) | Temperature (based on TEMP) | TEMP N | TEMP W | TEMP N+W | REF_CMD to be Skipped |
|---|---|---|---|---|---|---|---|---|---|
| 7 | N/A | T10~ | 15 | N/A | T10~ | | | | Skip |
| 6 | 0.25 | T8~T10 | 14 | 0.25 | T8~T10 | 128 | 8 | 136 | o |
| 5 | | T7~T8 | 13 | 0.25 | T7~T8 | 128 | 8 | 136 | f |
| 4 | 0.5 | T5~T7 | 12 | 0.5 | T51~T7 | 64 | 8 | 72 | c |
|  |  |  | 11 | 0.6 | T5~T51 | 64 | 8 | 72 | e |
| 3 | 1 | T3~T5 | 10 | 1 | T33~T5 | 32 | 8 | 40 | a |
|  |  |  | 9 | 1.1 | T32~T33 | 32 | 8 | 40 | b |
|  |  |  | 8 | 1.33 | T31~T32 | 32 | 8 | 40 | c |
|  |  |  | 7 | 1.7 | T3~T31 | 32 | 8 | 40 | d |
| 2 | 2 | T1~T3 | 6 | 2 | T12~T3 | 16 | 8 | 24 | a |
|  |  |  | 5 | 2.6 | T11~T12 | 16 | 8 | 24 | b |
|  |  |  | 4 | 3.4 | T1~T11 | 16 | 8 | 24 | c |
| 1 | 4 | ~T1 | 3 | 4 | T02~T1 | 8 | 8 | 16 | o |
|  |  |  | 2 | 4 | T01~T02 | | | | |
|  |  |  | 1 | 4 | ~T01 | | | | |
| 0 | N/A | N/A | 0 | N/A | N/A | N/A | N/A | N/A | N/A |

(0≤a≤b≤c≤d≤e≤f)

MEMORY DEVICE AND REFRESH METHOD THEREOF

CROSS-REFERENCE TO RELATED APPLICATION

This application claims priority under 35 USC § 119 from, and the benefit of, Korean Patent Application No. 10-2017-0002981, filed in the Korean Intellectual Property Office on Jan. 9, 2017, the contents of which are herein incorporated by reference in their entirety.

BACKGROUND

(a) Technical Field

Embodiments of the present disclosure are directed to a memory device and a refresh method thereof.

(b) Discussion of the Related Art

A memory device performs a refresh operation to maintain data stored in a memory cell. The refresh operation consumes power because charges required for the memory cell are charged again. To reduce power consumption of the refresh operation, the refresh operation may be performed differently based on the temperature. However, the operation of different memory devices may have different temperature dependencies due to different physical characteristics, placement positions, etc., for each memory device.

SUMMARY

Embodiments of the present disclosure can perform a refresh operation in response to a temperature of each memory device.

Further, embodiments of the present disclosure can appropriately respond to a rapid temperature increase of the memory device.

Further, embodiments of the present disclosure can perform a refresh operation even though disturbance is concentrated in a specific cell of the memory device.

An exemplary embodiment of the present disclosure provides a memory device that includes a memory cell array that includes a plurality of memory cell rows; a temperature sensor that detects a temperature of the memory cell array and generates internal temperature data; a first register that stores external temperature data received from outside of the memory device; and a refresh control unit that determines a skip ratio of refresh commands received at a refresh frequency that corresponds to the external temperature data by comparing the internal temperature data and the external temperature data and performing a refresh operation for the plurality of memory cell rows in response to the refresh commands skipped and transmitted based on the skip ratio.

Another exemplary embodiment of the present disclosure provides a method of refreshing a memory device that includes a memory cell array that includes a plurality of memory cell rows, where the method includes storing external temperature data received from a memory controller; determining a refresh period that corresponds to the external temperature data; and outputting a plurality of memory cell row addresses or at least one weak cell row address of the plurality of memory cell row addresses based on a ratio that corresponds to the refresh period, in response to a refresh command received from the memory controller, where weak cell rows of the memory cell array have a shorter data retention time than normal cell rows of the memory cell array.

Yet another exemplary embodiment of the present disclosure provides a memory system that includes a plurality of memory devices, each including a memory cell array that includes a plurality of memory cell rows and a temperature sensor that generates internal temperature data by detecting a temperature of the memory cell array; and a memory controller that receives the internal temperature data from the plurality of memory devices and outputs a refresh command for refreshing the plurality of memory cell rows to the plurality of memory devices at a frequency that corresponding to a highest temperature of the internal temperature data.

Still another exemplary embodiment of the present disclosure provides a memory device that includes a memory cell array that includes a plurality of memory cell rows; a temperature sensor that detects a temperature of the memory cell array and generates a first refresh rate data; a first register that stores second refresh rate data received from outside of the memory device; and a refresh control unit that performs a refresh operation for the plurality of memory cell rows in response to a received refresh command based on a result of comparing the first refresh rate data and the second refresh rate data.

Still another exemplary embodiment of the present disclosure provides a memory device that includes a memory cell array that includes a plurality of memory cell rows, where the memory cell rows include normal memory cell rows and weak memory cell rows that have a shorter data retention time than that normal memory cell rows, a first register that stores external temperature data received from outside the memory device, and a refresh control unit that determines a skip ratio of refresh commands received at a refresh frequency that corresponds to the external temperature data by comparing internal temperature data of the memory cell array and the external temperature data and performing a refresh operation for the plurality of memory cell rows in response to refresh commands skipped and executed based on the skip ratio, where a refresh operation is performed for at least one weak cell row in response to at least one of the received refresh commands.

According to the exemplary embodiments of the present disclosure, it is possible to reduce power consumption by a refresh operation.

According to the exemplary embodiments of the present disclosure, it is possible to improve safety of data stored in the memory cell.

BRIEF DESCRIPTION OF THE DRAWINGS

FIG. 11 is a table of examples of refresh ratios and a number of refresh commands to be skipped as determined according to a refresh method of an exemplary embodiment.

DETAILED DESCRIPTION OF EXEMPLARY EMBODIMENTS

In the following description, it is assumed that a semiconductor memory device is a dynamic random access memory (DRAM). However, technical concepts of the present disclosure may be applied to other semiconductor memory devices by those skilled in the art.

Figure 1:
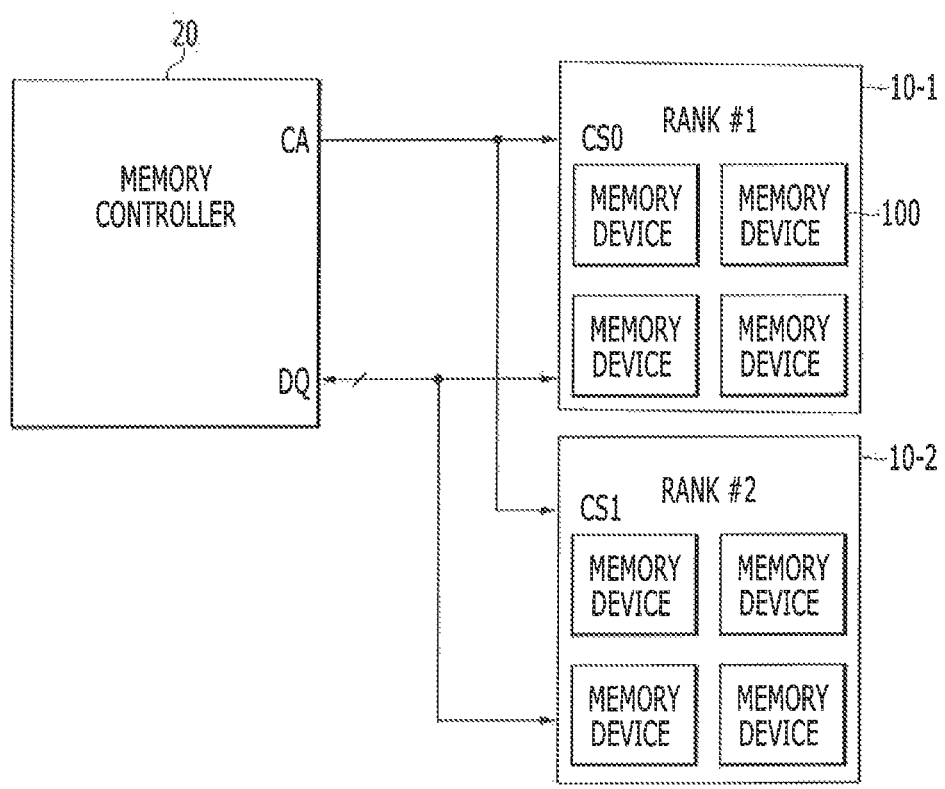
FIG. 1 schematically illustrates a memory system according to an exemplary embodiment.

FIG. 1 schematically illustrates a memory system according to an exemplary embodiment. A memory system includes a plurality of memory ranks 10-1 and 10-2 and a memory controller 20. For convenience of illustration, the memory system of FIG. 1 is illustrated as including two memory ranks 10-1 and 10-2 and each memory rank is illustrated as being configured by four memory devices 100. However, although FIG. 1 depicts two memory ranks 10-1 and 10-2 and four memory devices 100, embodiments of the disclosure are not limited thereto, and a memory system according to other embodiments may include more or fewer memory ranks, and each memory rank may include more or fewer memory devices.

According to an embodiment, the respective memory devices 100 included in the memory ranks 10-1 and 10-2 receives and executes a command/address signal CA from the memory controller 20 and transmits and receives a data signal DQ to or from the memory controller 20. The memory ranks 10-1 and 10-2 can be separately operated by chip selection signals CS0 and CS1.

According to an embodiment, the memory controller 20 controls an overall operation of the memory device 100, for example, a read, write, or refresh operation and may be implemented by, at least in part, a system on chip (SoC).

Next, referring to FIG. 2, the memory device 100 will be described in detail.

Figure 2:
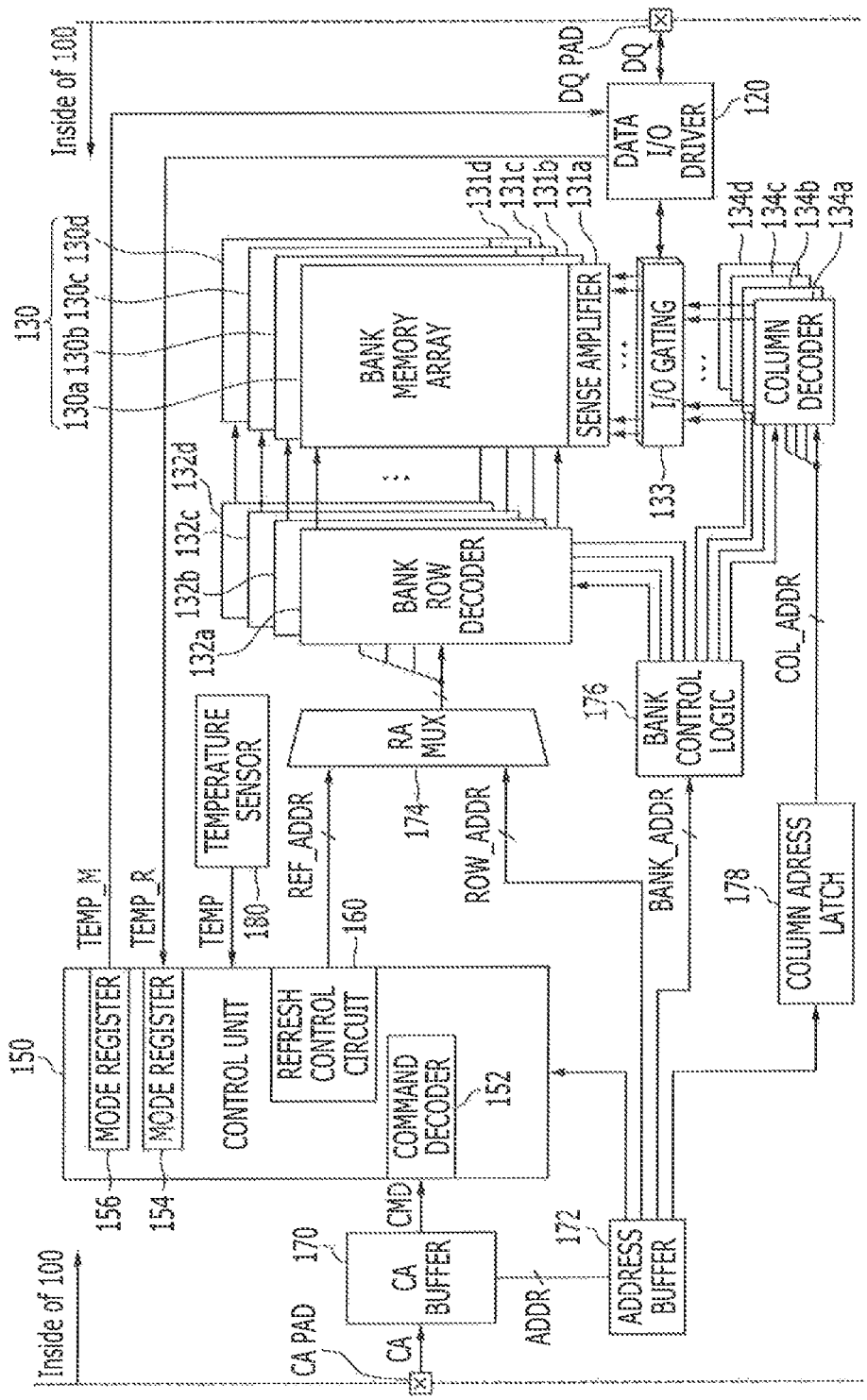
FIG. 2 is a block diagram of a memory device illustrated in FIG. 1.

FIG. 2 is a block diagram of a memory device 100 illustrated in FIG. 1. The memory device 100 illustrated in FIG. 2 is exemplary and non-limiting and the memory device configuration can be modified in other embodiments. Further, although FIG. 2 illustrates first to fourth bank memory arrays 130a to 130d, this is for convenience of illustration and embodiments are not limited thereto. For example, four or more bank arrays may be provided in the memory device 100 in other exemplary embodiments.

According to embodiments, the memory device 100 may include one or more memory chips, and FIG. 2 illustrates an exemplary, non-limiting configuration of one such memory chip. The memory device 100 includes a data I/O driver 120, a memory cell array 130 including first to fourth bank memory arrays 130a to 130d, sense amplifiers 131a to 131d arranged corresponding to the bank arrays 130a to 130d, bank row decoders 132a to 132d and column decoders 134a to 134d, an I/O gating circuit 133, a control unit 150, a refresh control circuit 160, a CA buffer 170, an address buffer 172, a row address selector 174, a bank control logic 176, a column address latch 178, and a temperature sensor 180. The refresh control circuit 160 may be included in the control unit 150 or configured separately.

According to embodiments, the memory device 100 may be a dynamic random access memory (DRAM) such as a double data rate synchronous dynamic random access memory (DDR SDRAM), a low power double data rate (LPDDR) SDRAM, a graphics double data rate (GDDR) SDRAM, or a rambus dynamic random access memory (RDRAM). Alternatively, in other exemplary embodiments, the memory device 100 may be any another memory device that requires a refresh operation, such as a resistive memory device.

According to embodiments, the control unit 150 controls an overall operation of the memory device 100 and includes a command decoder 152, the refresh control circuit 160, and mode registers 154 and 156. The control unit 150 generates control signals to perform a write operation or a read operation according to a command CMD received from the memory controller 20. Further, the control unit 150 generates control signals for the refresh operation for the first to fourth bank memory arrays 130a to 130d based on a refresh command received from the memory controller 20.

According to embodiments, the mode registers 154 and 156 store information for setting an operational environment of the memory device 100. In detail, the mode register 154 store external temperature data TEMP_R received from a DQ pad when a mode register write (MRW) command is received from the memory controller 20.

In addition, according to embodiments, the mode register 156 stores output temperature data TEMP_M that is based on an internal temperature data TEMP detected by the temperature sensor 180 and transmitted to the control unit 150. When a mode register read (MRR) command is received from the memory controller 20, the output temperature data TEMP_M is transmitted to the memory controller 20 through the DQ pad.

According to embodiments, the internal temperature data TEMP includes first refresh rate data that corresponds to the temperature detected by the temperature sensors 180 in each memory device 100. The first refresh rate data is set to correspond to the detected temperature. As the detected temperature increases, the value of the first refresh rate data value is increased to shorten a refresh period.

According to embodiments, the output temperature data TEMP_M includes a second refresh rate data that is based on the first refresh rate data. The second refresh rate data has fewer bits than the first refresh rate data. For example, mode register 156 may store a memory address of a section of a plurality of divided sections that receives the transmitted first refresh rate data as the second refresh data.

According to embodiments, the external temperature data TEMP_R includes at least one of the second refresh rate data received from each memory device 100 by the memory controller 20. For example, the memory controller 20 may transmit a maximum of the second refresh rate data values to each memory device 100 as the external temperature data TEMP_R. As another example, the memory controller 20 may transmit, to one memory device 100, a maximum of the second refresh rate data values and a medium second refresh rate data value to other memory devices. The memory controller 20 selects at least one of the received second refresh rate data values to be transmitted to each of the memory devices 100, but embodiments are not limited to the description above.

According to embodiments, the internal temperature data TEMP and the output temperature data TEMP_M each have a different number of bits, and the internal temperature data TEMP and the external temperature data TEMP_R may each have a different number of bits. For example, the external temperature data TFMP_R and the output temperature data TEMP_M may each have 3-bits, and the internal temperature data TEMP may have 4-bits.

According to embodiments, the CA buffer 170 synchronizes with an internal clock signal to latch the input command/address signal CA. The latched command CMD and address ADDR are provided to the command decoder 152 and the address buffer 172, respectively.

According to embodiments, the address buffer 172 receives the address ADDR. The address ADDR includes a bank address BANK_ADDR. Further, the address ADDR includes a row address ROW_ADDR for addressing rows of the memory cell array 130 and a column address COL_ADDR for addressing columns. The row address ROW_ADDR is provided to the bank row decoders 132a to 132d through the row address selector 174 and the column address COL_ADDR is provided to the column decoders 134a to 134d through the column address latch 178. Further, the bank address BANK_ADDR may be provided to the bank control logic 176.

According to embodiments, the bank control logic 176 generates bank control signals in response to the bank address BANK_ADDR. Further, in response to the bank control signals, a bank row decoder of the first to fourth bank row decoders 132a to 132d that corresponds to the bank address BANK_ADDR is activated, and further, a column decoder of the first to fourth column decoders 134a to 134d that corresponds to the bank address BANK_ADDR is activated.

According to embodiments, the refresh control circuit 160 generates a refresh row address REF_ADDR that selects a row in the memory cell array 130 on which the refresh is to be performed. The refresh control circuit 160 generates a refresh row address REF_ADDR using the refresh command, the external temperature data TEMP_R, and the internal temperature data TEMP.

According to embodiments, the row address selector 174 can be implemented by a multiplexer. The row address selector 174 receives the row address ROW_ADDR from the address buffer 172 and receives the refresh row address REF_ADDR from the refresh control circuit 160. The row address selector 174 selectively outputs the row address ROW_ADDR or the refresh row address REF_ADDR. The row address output from the row address selector 174 is provided to the first to fourth bank row decoders 132a to 132d, respectively.

According to embodiments, the bank row decoder of the first to fourth bank row decoders 132a to 132d that is activated by the bank control logic 176 decodes the row address received from the row address selector 174 to activate a word line corresponding to the row address. For example, the activated bank row decoder may apply a word line driving voltage to the word line that corresponds to the row address.

According to embodiments, the column address latch 178 receives a column address COL_ADDR from the address buffer 172 and temporarily stores the received column address COL_ADDR. The column address latch 178 provides the stored column address COL_ADDR to the first to fourth column decoders 134a to 134d, respectively.

According to embodiments, the bank column decoder of the first to fourth column decoders 134a to 134d that is activated by the bank control logic 176 activates sense amplifiers that correspond to the bank address BANK_ADDR and the column address COL_ADDR through the I/O gating circuit 133.

According to embodiments, the I/O gating circuit 133 includes an input data mask logic, read data latches that store data received from the first to fourth bank memory arrays 130a to 130d, and a write driver that writes the data in the first to fourth bank memory arrays 130a to 130d, together with circuits that gate the I/O data.

According to embodiments, the write data to be written in the memory cell array of one bank array of the first to fourth bank memory arrays 130a to 130d is received by the data I/O driver 120 through the DQ pad DQ PAD from the memory controller 20. The data received by the data I/O driver 120 is written in one bank array through the write driver.

Next, according to embodiments, the refresh control circuit 160 of an exemplary embodiment will be described in detail with reference to FIG. 3.

Figure 3:
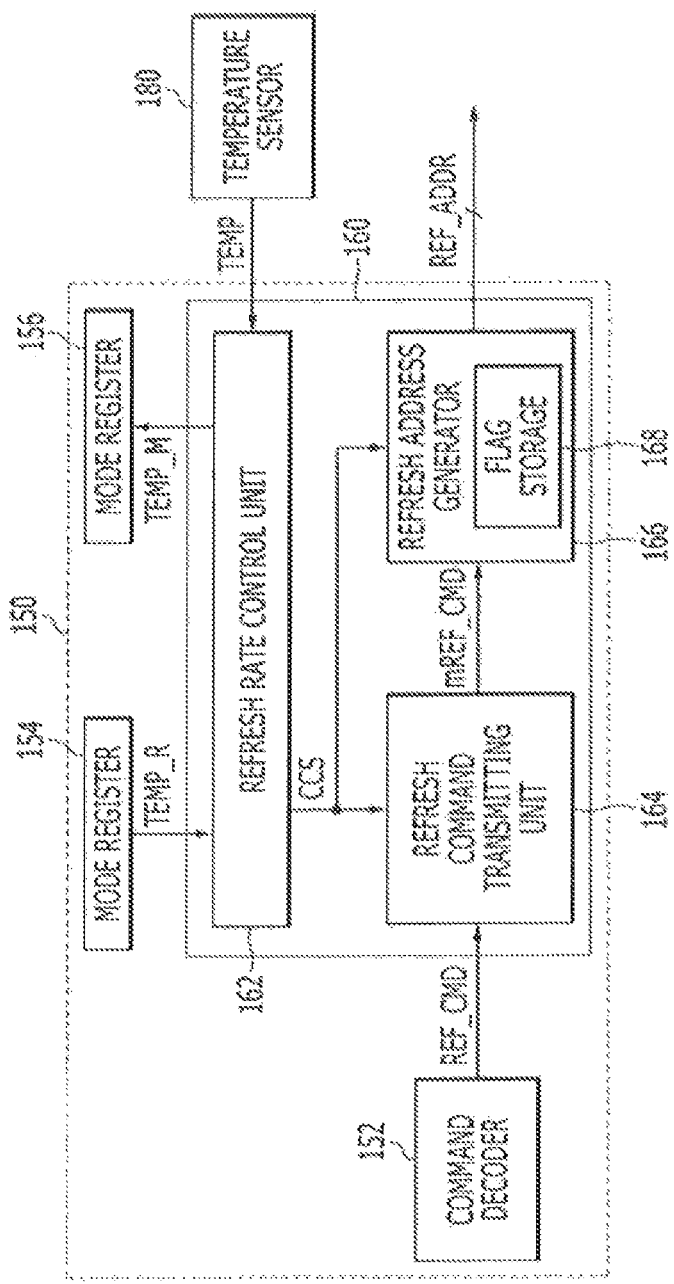
FIG. 3 is a block diagram that illustrates some configurations of a memory device illustrated in FIG. 2.

FIG. 3 is a block diagram that illustrates some configurations of a memory device illustrated in FIG. 2 in detail. According to embodiments, as illustrated in FIG. 3, the refresh control circuit 160 receives a refresh command REF_CMD from the command decoder 152. The refresh control circuit 160 receives the external temperature data TEMP_R from the mode register 154 and receives the internal temperature data TEMP from the temperature sensor 180. In addition, the refresh control circuit 160 outputs the refresh row address REF_ADDR.

According to embodiments, the refresh control circuit 160 includes a refresh rate control unit 162, a refresh command transmitting unit 164 and a refresh address generator 166.

First, according to embodiments, the temperature sensor 180 outputs a value corresponding to one of a plurality of n sections, n is a positive number, that correspond to the detected temperature as the internal temperature data TEMP.

According to embodiments, the command decoder 152 receives and decodes the command CMD. The command decoder 152 decodes a write enable signal, a row address strobe signal, a column address strobe signal, a chip selection signal, etc., to generate control signals that correspond to the command CMD. The command decoder 152 transmits a refresh command REF_CMD to the refresh control circuit 160 which generates a refresh row address REF_ADDR for the refresh. The refresh command REF_CMD includes predetermined pulses having refresh time intervals and the refresh address generator 166 performs a count operation in response to level changes of the pulses.

According to embodiments, the refresh rate control unit 162 receives internal temperature data TEMP from the temperature sensor 180. The refresh rate control unit 162 generates output temperature data TEMP_M using the internal temperature data TEMP and stores the generated output temperature data TEMP_M in the mode register 156. The refresh rate control unit 162 generates the output temperature data TEMP_M by increasing a value that corresponds to the section that includes the internal temperature.

In detail, according to embodiments, the refresh rate control unit 162 generates, as the output temperature data TEMP_M, a value that corresponds to one of m temperature sections where m is a positive number, m≤n, that is greater than the detected internal temperature.

For example, assuming that among the m sections, a first section corresponds to a temperature of between 40° C. and 50° C., and a second section corresponds to a temperature between 50° C. and 60° C. When the internal temperature data TEMP value is included in the first section, the refresh rate control unit 162 generates an output temperature data TEMP_M value that corresponds to the second section.

According to embodiments, the refresh rate control unit 162 receives the external temperature data TEMP_R from the mode register 154. The external temperature data TEMP_R is received as a DQ signal from the memory controller 20. The external temperature data TEMP_R may be temperature data received a memory device included in another rank. The external temperature data TEMP_R may be temperature data received from another memory device of a rank that includes the memory device 100.

According to embodiments, the refresh rate control unit 162 determines a refresh period or frequency of the refresh command received from the memory controller 20 by using the external temperature data TEMP_R, and generates a memory command for refreshing all of the memory cell rows for one refresh period.

According to embodiments, the refresh period is a period required to refresh all memory cell rows included in the memory device 100. According to volatile memory device standards, the refresh period changes according to temperature.

According to embodiments, the refresh rate control unit 162 determines a ratio of a normal cell row address refresh operation and a weak cell row address refresh operation by using the determined refresh period.

According to embodiments, the number of weak cells, which are memory cells that have a relatively short data retention time, is increased. To maintain the data stored in the weak cells while sequentially refreshing the memory cell rows, a weak cell rows refresh operation is performed at least once between a normal cell row refresh operations.

That is, according to embodiments, the refresh rate control unit 162 determines a ratio, hereinafter referred to as a weak cell refresh ratio, of a normal cell row refresh operation command and a weak cell row refresh operation command of the input refresh commands REF_CMD, based on the determined refresh period.

According to the refresh period, the weak cell refresh ratio is i:j, where i and j are positive numbers and i:j is a ratio of a normal cell row refresh operation commands and a weak cell row refresh operation commands. When the refresh period is short, an i/j value is greater than that of a case where the refresh period is long.

In addition, according to embodiments, the refresh rate control unit 162 determines a ratio, hereinafter referred to as a command skip ratio, between a non-skipped refresh command and a skipped refresh command of the normal cell row refresh operations by using the internal temperature data TEMP and the external temperature data TEMP_R.

According to embodiments, the refresh rate control unit 162 does not skip the refresh command when the temperature section that includes the detected internal temperature is a temperature section higher than the temperature section that includes the external temperature.

Further, according to embodiments, the refresh rate control unit 162 skips the refresh command when the temperature section that includes the detected internal temperature is in the temperature section that includes the external temperature.

In this case, according to embodiments, the refresh rate control unit 162 further determines a command skip ratio.

For example, suppose the same external temperature data is received but that the internal temperatures are included in different temperature sections and the internal temperature data have different values. In the case where the internal temperature is included in the temperature section corresponding to a relatively high temperature, the command skip ratio is determined to more frequently skip the refresh command, as compared with the case where the internal temperature is included in the temperature section corresponding to a relatively low temperature.

According to embodiments, the refresh rate control unit 162 generates a control signal CCS by using the command skip ratio and the weak cell refresh ratio.

For example, according to embodiments, the refresh rate control unit 162 determines the weak cell refresh ratio as a:b and determines the command skip ratio as c:d, where a, b, c, and d are positive numbers and c+d=a. When a+b refresh commands are received, the refresh rate control unit 162 determines a refresh commands for the normal cell row refresh operations, determines b refresh commands for the weak cell row refresh operations, and generates a control signal CCS to control d refresh commands for the skipped normal cell row refresh operations.

According to embodiments, the refresh command transmitting unit 164 transmits a refresh command mREF_CMD in which some refresh commands of the input refresh commands REF_CMD are skipped, based on the control signal CCS.

In detail, according to embodiments, when a+b refresh commands REF_CMD are received, the refresh command transmitting unit 164 skips d refresh commands of the a normal cell row refresh operation commands and transmits c refresh commands mREF_CMD.

In this case, according to embodiments, the refresh command transmitting unit 164 skips the refresh command at the command skip ratio. For example, let the weak cell refresh ratio be 32:8 and the command skip ratio be 28:4. When 40 refresh commands are received, the refresh command transmitting unit 164 skips four refresh commands of the 32 normal cell row refresh operation commands. The refresh command transmitting unit 164 outputs 28 refresh commands for normal cell row refresh operations at a ratio of 7:1, a ratio determined by the greatest common divisor of 28 and 4, and skips four refresh commands. That is, the refresh command transmitting unit 164 skips four refresh commands when 32 refresh commands are received, by skipping one refresh command while outputting 7 refresh commands.

Next, according to embodiments, the refresh address generator 166 generates a refresh row address REF_ADDR so that the memory cells connected to the memory cell row are refreshed in response to the input refresh command mREF_CMD.

According to embodiments, the refresh address generator 166 includes an address counter therein. The refresh address generator 166 performs a counting operation while executing the normal cell row refresh operation commands. The refresh address generator 166 sequentially generates normal cell row addresses by increasing values according to the counting operation.

According to embodiments, the refresh address generator 166 includes a flag storage 168 that stores a weak cell flag that represents whether the corresponding memory cell row is a weak cell row. The refresh address generator 166 generates a weak cell row address corresponding to a weak cell flag in response to a weak cell row refresh operation command.

According to embodiments, the refresh address generator 166 outputs a normal cell row address according to some input refresh commands mREF_CMD and outputs a weak cell row address according other refresh commands, by using the control signal CCS.

According to embodiments, a ratio of an operation of outputting the normal cell row address and an operation of outputting the weak cell row address can be determined by the weak cell refresh ratio and the command skip ratio of the control signal CCS.

For example, let a weak cell refresh ratio be 32:8 and a command skip ratio be 28:4. The refresh address generator 166 sequentially outputs the normal cell row addresses when 28 input refresh commands mREF_CMD are received, and outputs a weak cell row address in response to 8 refresh commands mREF_CMD received after outputting the normal cell row address.

Hereinafter, according to embodiments, a refresh method of the memory device 100 that includes the refresh control circuit 160 configured above will be described with reference to FIGS. 4 and 5.

Figure 4:
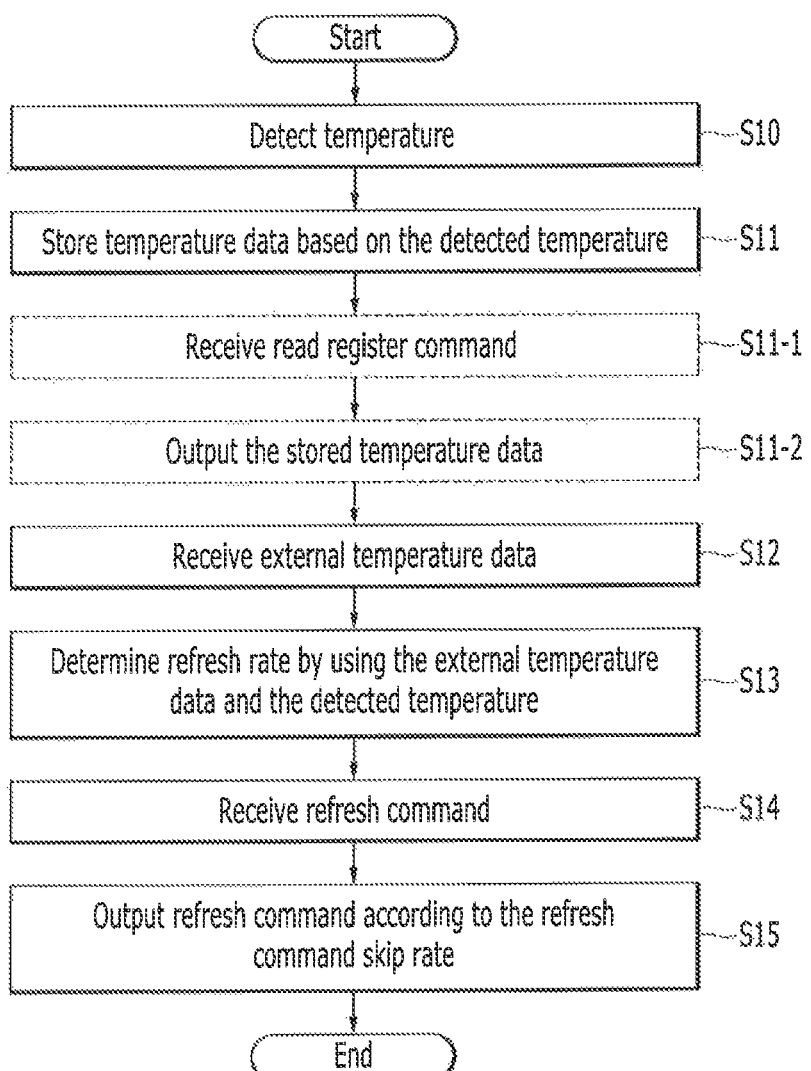
FIG. 4 is a flowchart of a refresh method of a memory device according to an exemplary embodiment.
Figure 5:
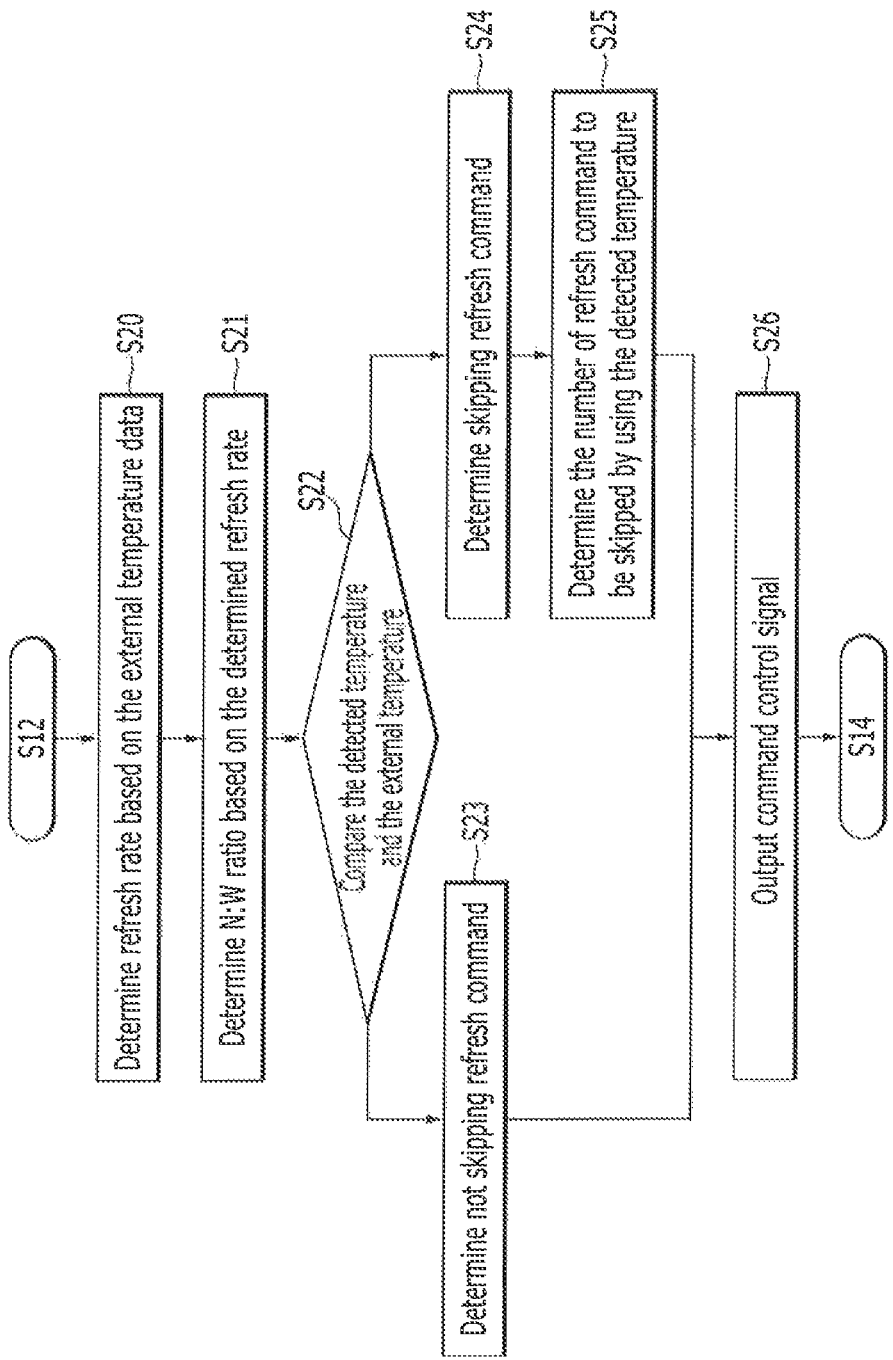
FIG. 5 is a detailed flowchart of some steps in a method of FIG. 4.

FIG. 4 is a flowchart of a refresh method of a memory device according to an exemplary embodiment and FIG. 5 is a detailed flowchart of some steps in a method of FIG. 4.

According to embodiments, referring to FIG. 4, first, a temperature sensor 180 detects an internal temperature (S10). The temperature sensor 180 is provided in each memory device 100 to detect a temperature in a corresponding region. The temperature sensor 180 outputs internal temperature data to the control unit 150.

According to embodiments, the control unit 150 generates output temperature data based on the internal temperature data and stores the generated output temperature data in the mode register 156 (S11).

In this case, the memory device 100 receives an MRR command from the memory controller 20 (S11-1) and outputs the temperature data TEMP_M stored in the mode register 156 to the memory controller 20 (S11-2).

In detail, according to embodiments, the memory controller 20 outputs a CA signal that includes the MRR command with respect to some or all of the memory devices 100. The memory device 100 that receives the MRR command outputs the output temperature data TEMP_M stored in the mode register 156 to the memory controller 20.

According to embodiments, the memory controller 20 changes a refresh period according to the output temperature of the output temperature data TEMP_M. For example, the memory controller 20 decreases the refresh period when the value of the output temperature is high and increases the refresh period when the value of the output temperature is low.

According to embodiments, when the memory controller 20 receives output temperature data TEMP_M from a plurality of memory devices 100, respectively, the memory controller 20 compares values of the output temperatures. The memory controller 20 changes a refresh period based on the highest output temperature.

According to embodiments, the memory controller 20 generates a CA signal to transmit the refresh command corresponding the changed refresh period to the memory device 100. Further, the memory controller 20 transmits the output temperature data used to set the MRW command and the refresh period to the memory devices 100 as the external temperature data TEMP_R.

According to embodiments, the memory device 100 receives the external temperature data TEMP_R transmitted to the DQ pad DQ PAD in response to the MRW command (S12) and stores the received external temperature data in the mode register 154

According to embodiments, the refresh rate control unit 162 determines the command skip ratio and the weak cell refresh ratio using the external temperature data TEMP_R and the internal temperature data TEMP (S13).

Step S13 will be described with reference to FIG. 5. According to embodiments, as illustrated in FIG. 5, the refresh rate control unit 162 determines the refresh period of the refresh command input from the memory controller 20 using the external temperature data TEMP_R (S20).

According to embodiments, the refresh rate control unit 162 determines the weak cell refresh ratio according to the determined refresh period (S21). Steps S20 and S21 will be described with reference to FIGS. 6 and 7.

Figure 6:
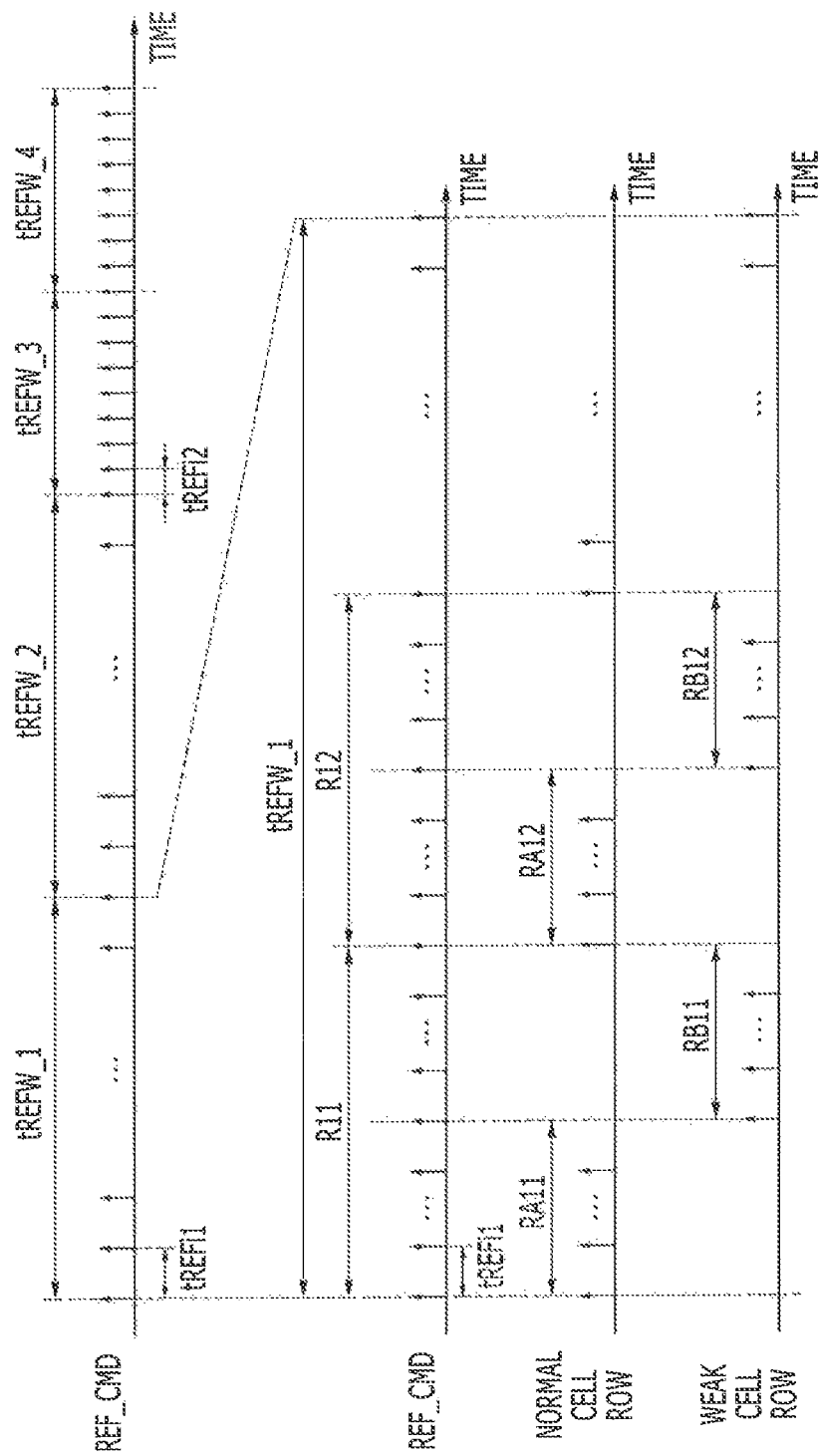
FIGS. 6 and 7 are timing diagrams of examples of refreshing memory cell rows performed according to a refresh method of an exemplary embodiment.
Figure 7:
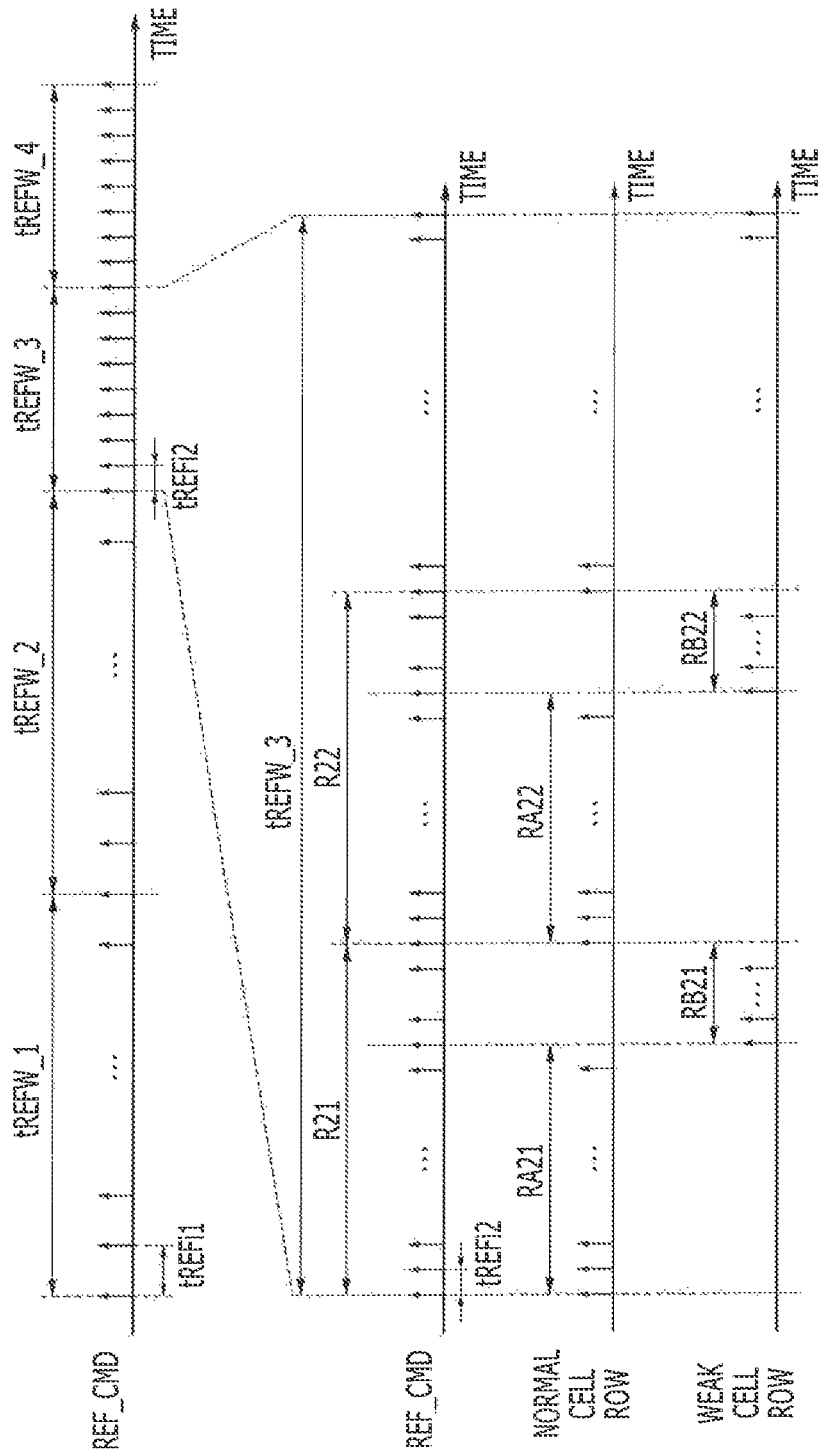

FIGS. 6 and 7 are timing diagrams of examples of refreshing memory cell rows performed according to a refresh method of an exemplary embodiment.

Referring to FIGS. 6 and 7, according to embodiments, a refresh period tREFW_1 and a refresh period tREFW_2 are the same as each other and a cycle between the refresh commands is tREFi1. A refresh period tREFW_3 and a refresh period tREFW_4 are the same as each other and a cycle between the refresh commands is tREFi2. The same number of refresh commands may be received for the refresh periods tREFW_1 to tREFW_4.

Further, according to embodiments, since the refresh period tREFW_3 is shorter than the refresh period tREFW_1, the refresh period tREFW_3 may be a refresh period corresponding to a higher temperature. According to embodiments, it is assumed that the refresh period tREFW_1 is twice as long as the refresh period tREFW_3.

According to embodiments, the refresh rate control unit 162 determines a weak cell refresh ratio by decreasing a ratio of input refresh commands for refreshing the weak cell rows, as the refresh period determined based on an external temperature is shorter.

For example, the refresh rate control unit 162 can determine that the weak cell refresh ratio is i1:j1 in the refresh period tREFW_1, and that the weak cell refresh ratio is i2:j2 in the refresh period tREFW_3. In this case, i2/j2 is greater than i1/j1. According to embodiments, it is assumed that i1=16, j1=8, i2=32, and j2=8.

According to embodiments, one refresh period tREFW_is divided into a plurality of sections R11, R12, . . . based on the number of refresh commands. 40 refresh commands are received for a section R11. Since the weak cell refresh ratio is i1:j1 (32:8), 32 of the 40 refresh commands received for a section RA11 are determined to be normal cell row refresh operation commands and the remaining 8 refresh commands for a section RB11 are determined to be weak cell row refresh operation commands.

Similarly, according to embodiments, and referring now to FIG. 7, one refresh period tREFW_3 can be divided into a plurality of sections R21, R22, . . . based on the number of refresh commands. 72 refresh commands are received for a section R21.

Since the weak cell refresh ratio is i2:j2 (64:8), 64 of 72 refresh commands for a section R21 are determined to be normal cell row refresh operation commands and the remaining 8 refresh commands for a section RB21 are determined to be weak cell row refresh operation commands.

According to embodiments, since the weak cell row refresh operation is influenced by factors other than the temperature, the weak cell row refresh operation should be performed at a predetermined time period even though the refresh period changes based on temperature changes. That is, even though the refresh commands are received with a decreased refresh period, i.e. more frequently, based on an increased temperature, the weak cell row refresh operation should be performed at substantially the same time interval.

According to embodiments, as illustrated in FIGS. 6 and 7, the refresh period tREFW_1 is twice as long as the refresh period tREFW_3 and the same number of refresh commands are received at each refresh period. Therefore, a length of the section RA11 in which 32 normal cell row refresh commands are received in FIG. 6 and a length of the section RA21 in which 64 normal cell row refresh commands are received in FIG. 7 are equal to each other. The weak cell row refresh operation is performed using the refresh commands received after the refresh commands used for the normal cell row refresh are received.

According to a refresh method of an exemplary embodiment, even in the case where the refresh periods determined based on an external temperature differ from each other, when the same refresh period times RA11 and RA21 elapse, the weak cell refresh ratio can be determined to use a predetermined number of refresh commands for the weak cell row refresh operation.

Next, according to embodiments, referring back to FIG. 5, the refresh rate control unit 162 compares an internal temperature of the internal temperature data TEMP and an external temperature of the external temperature data TEMP_R (S22).

According to embodiments, the refresh rate control unit 162 does not skip the refresh command when the temperature section of the internal temperature is a temperature section higher than the temperature section of the external temperature (S23).

According to embodiments, the refresh rate control unit 162 skips the refresh command when the temperature section of the internal temperature is the temperature section of the external temperature (S24).

According to embodiments, the refresh rate control unit 162 determines a command skip ratio using the internal temperature data TEMP (S25). In this case, the ratio of the refresh commands skipped at the command skip ratio when the internal temperature is low is greater than the command skip ratio when the internal temperature is high.

According to embodiments, the refresh rate control unit 162 generates the control signal CCS using the command skip ratio and weak cell refresh ratio (S26).

The steps S23 to S25 will be described with reference to FIG. 8.

Figure 8:
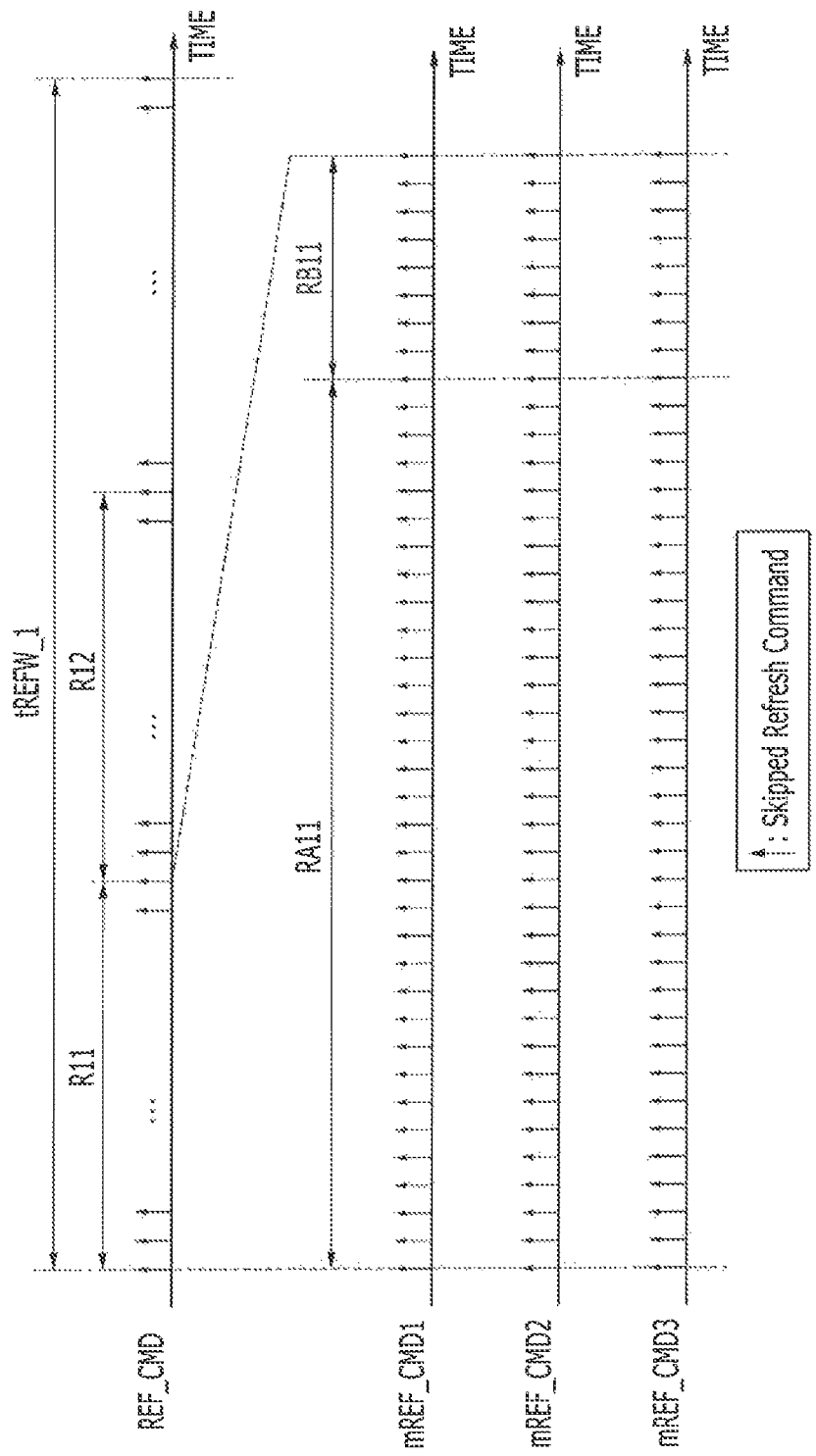
FIG. 8 is a timing diagram of examples of refreshing memory cell rows skipped according to a refresh method of an exemplary embodiment.

FIG. 8 is a timing diagram of examples of refreshing memory cell rows skipped according to a refresh method of an exemplary embodiment. As illustrated in FIG. 8, one refresh period tREFW_1 can be divided into a plurality of sections R11, R12, . . . based on the number of refresh commands. 40 refresh commands can be received for a section R11. Since the weak cell refresh ratio is i1:j1 (32:8), 32 of 40 refresh commands received for a section RA11 are normal cell row refresh operation commands and the remaining 8 refresh commands received for a section RB11 are weak cell row refresh operation commands.

According to embodiments, the refresh rate control unit 162 determines whether to skip the refresh command and the command skip ratio by using the internal temperature and the external temperature. In this case, when the section of the external temperature is unchanged, the command skip ratio is determined so that a ratio of skipped refresh commands when the internal temperature is low is greater than when the internal temperature is high.

According to embodiments, the internal temperature is highest at the mREF_CMD3 and the internal temperature may be decreased from mREF_CMD2 to mREF_CMD1.

According to embodiments, the refresh rate control unit 162 generates a control signal CCS to execute the refresh commands, such as mREF_CMD3, when the temperature section of the internal temperature is a section higher than the temperature section of the external temperature.

According to embodiments, the refresh rate control unit 162 generates a control signal CCS to skip the refresh commands, such as mREF_CMD1 or mREF_CMD2, when the temperature section of the internal temperature is a section of the external temperature. The ratio of the skipped normal cell row refresh operation commands for mREF_CMD1 is greater than the ratio for mREF_CMD2.

For example, let mREF_CMD1 represent a refresh command when the command skip ratio to be 16:16. In this case, the refresh command transmitting unit 164 skips 16 of 32 refresh commands received for the section RA11. The refresh command transmitting unit 164 outputs 16 refresh commands at a ratio of 1:1 and skips 16 refresh commands. That is, the refresh command transmitting unit 164 skips 16 refresh commands when 32 refresh commands are received, by skipping one refresh command when executing one refresh command.

As another example, let mREF.CMD2 represent a refresh command when the command skip ratio as 24:8. In this case, the refresh command transmitting unit 164 skips 8 of 32 refresh commands received for the section RA11. The refresh command transmitting unit 164 outputs 24 refresh commands at a ratio of 3:1 and skips 8 refresh commands. That is, the refresh command transmitting unit 164 skips 8 refresh commands when 32 refresh commands are received, by skipping one refresh command when executing three refresh commands.

Referring back to FIG. 4, a refresh method according to an embodiment will be described. The refresh control circuit 160 receives a refresh command REF_CMD (S14). The refresh command transmitting unit 164 and the refresh address generator 166 output the received refresh command REF. CMD to the row address selector 174 as the refresh row address REF_ADDR using the control signal CCS (S15). Then, the row address selector 174 applies the refresh row address REF_ADDR to the first to fourth bank row decoders 132a to 132d, respectively, and the first to fourth bank row decoders 132a to 132d activate word lines corresponding to the refresh row address REF_ADDR.

Next, according to embodiments, a refresh period change for a temperature according to a refresh method of an exemplary embodiment will be described with reference to FIGS. 9 and 10.

Figure 9:
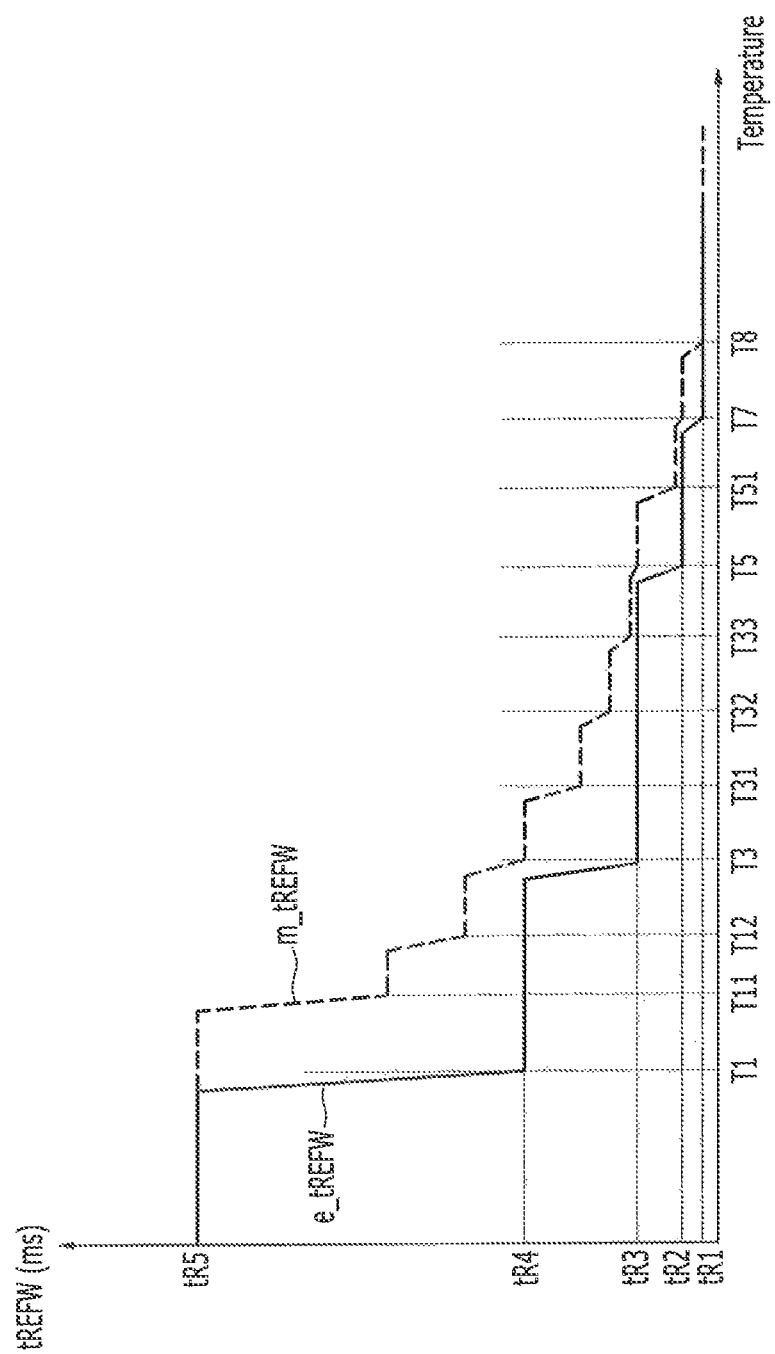
FIGS. 9 and 10 are graphs that illustrate a temperature and a period of tREFW according to a refresh method of an exemplary embodiment.
Figure 10:
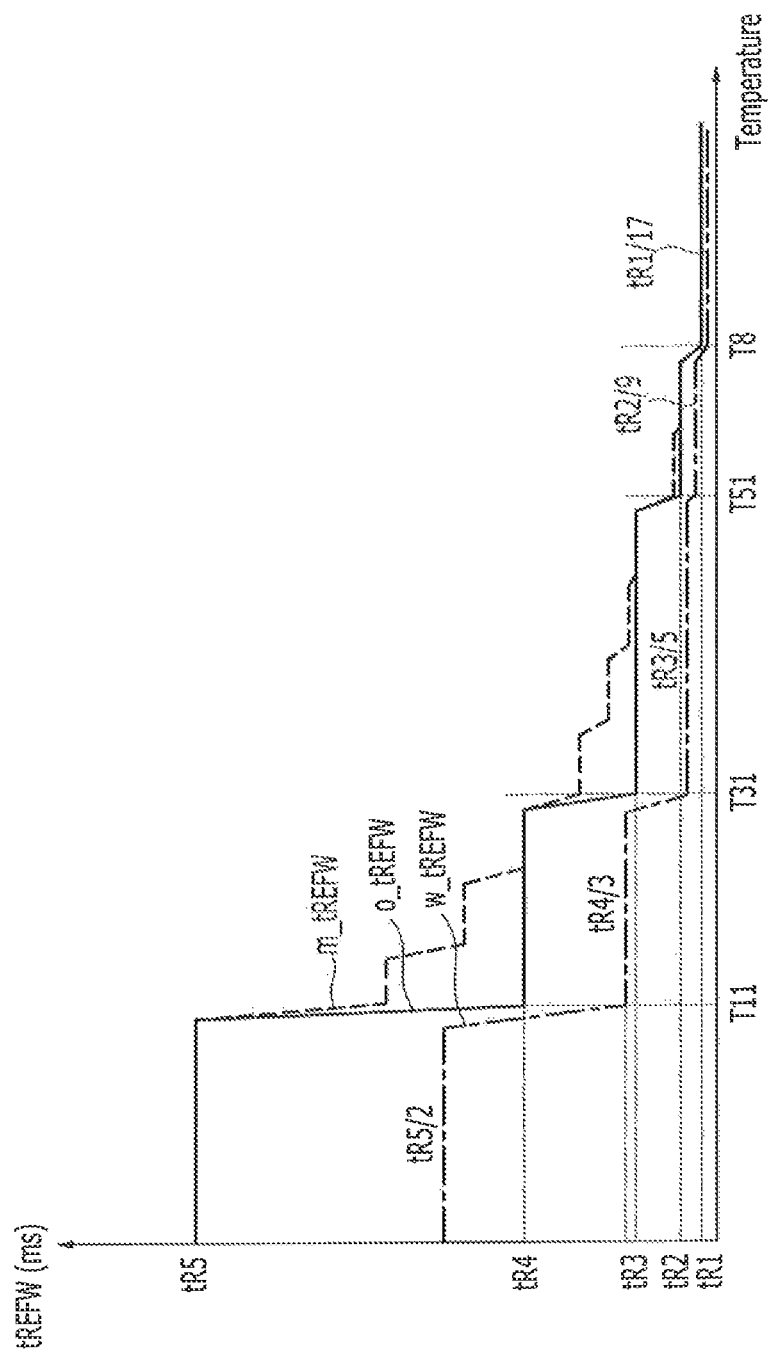

FIGS. 9 and 10 are graphs that illustrate a temperature and a section of tREFW according to a refresh method of an exemplary embodiment.

According to embodiments, as illustrated in FIG. 9, a refresh period e_tREFW is a refresh period of a refresh command received from the memory controller 20 and a refresh period m_tREFW is a refresh period of a refresh command output as the refresh row address REF_ADDR by the refresh control circuit 160.

At a temperature section T1 or less and a temperature section T8 or more, the refresh period m_tREFW is the same as the refresh period e_tREFW.

At a section between temperature T1 and temperature T8, the refresh period m_tREFW is longer than the refresh period e_tREFW. In a refresh method of an exemplary embodiment, since the refresh command received may be skipped based on the internal temperature, the refresh period m_tREFW is longer than the refresh period e_tREFW.

For example, at a section between temperature T1 and temperature T3, the refresh period e_tREFW is tR4 (ms), and the refresh period m_tREFW is longer than tR4.

According to a refresh method of an exemplary embodiment, since the refresh period m_tREFW is longer than the refresh period e_tREFW, power consumption of a refresh operation may be reduced.

Next, according to embodiments, as illustrated in FIG. 10, in a refresh method of an exemplary embodiment, the weak cell refresh ratio changes based on a refresh period o_tREFW determined by the external temperature data TEMP_R. When the refresh period varies, the number of refresh commands received for the same time varies in response thereto.

For example, the memory controller 20 receives the temperature of the memory device 100 by the MRR command output at a current time. The memory controller 20 compares a temperature section of a current point temperature and a section a temperature previously received by the MRR command. The memory controller 20 outputs, to the memory device 100, the number of refresh commands, which may be doubled for a predetermined time when the current temperature section increases by one section compared with the previous temperature section. Then, the refresh control circuit 160 halves the ratio of weak cell row refresh commands with respect to the normal cell row refresh commands, for example, decreasing from 32:8 to 64:8, when the number of refresh commands were increased from 32 to 64).

Therefore, according to a refresh method of an exemplary embodiment, even when the refresh periods determined according to an external temperature differ from each other, when the same refresh time periods elapse, the weak cell refresh ratio is determined to use a predetermined number of weak cell row refresh operation commands.

Next, according to embodiments, the external temperature data TEMP_R, the refresh period determined by the external temperature, the internal temperature data TEMP, the refresh period determined by the internal temperature, the weak cell refresh ratio and the command skip ratio will be described as an example with reference to FIG. 11.

FIG. 11 is a table of examples of refresh ratios and a number of refresh commands to be skipped as determined according to a refresh method of an exemplary embodiment. As illustrated in FIG. 11, a temperature section of the external temperature data TEMP_R is divided into a total of 7 sections, such as temperature section 1 of T1 or less, temperature section 2 of T1 to T3, temperature section 3 of T3 to T5, temperature section 4 of T5 to 17, temperature section 5 of T7 to T8, temperature section 6 of T8 to T10, and temperature section 7 of T10 or greater.

According to embodiments, the refresh rate control unit 162 determines a refresh period based on the external temperature data TEMP_R. The refresh periods of the temperature sections 1 to 6 are, respectively, 0.25, 0.5, 1, 2, 4, etc., by setting the refresh period of the temperature section 3 as 1. In this case, since the memory device 100 does not operate for temperature section 7 of T10 or greater, the description thereof will be omitted.

According to embodiments, the refresh rate control unit 162 determines a weak cell refresh ratio N:W based on the refresh period determined based on the external temperature data TEMP_R.

In addition, according to embodiments, the temperature section of the internal temperature data TEMP can be divided into a total of 15 sections. For example, temperature section 1 can be divided into three sections, temperature section 2 can be divided into three sections, temperature section 3 can be divided into four sections, and temperature section 4 can be divided into two sections, while temperature sections 5 to 7 are not further divided.

According to embodiments, the refresh rate control unit 162 determines the command skip ratio by comparing the temperature section of the internal temperature and the temperature section of the external temperature. For example, when the external temperature is in temperature section 3 and the detected internal temperature is in sections T31 to T32 of temperature section 3, the refresh rate control unit 162 determines the command skip ratio as 32-a:a. For another example, when the external temperature is in temperature section 3 and the detected internal temperature is in sections T36 to T5 of temperature section 3, the refresh rate control unit 162 determines the command skip ratio as 32-a:a.

According to embodiments, the refresh rate control unit 162 does not skip the refresh command when the temperature section of the internal temperature is in a temperature section higher than the temperature section of the external temperature. For example, when the external temperature is in temperature section 3 and the detected internal temperature is in temperature section 4, the refresh rate control unit 162 does not skip the refresh command.

Figure 12:
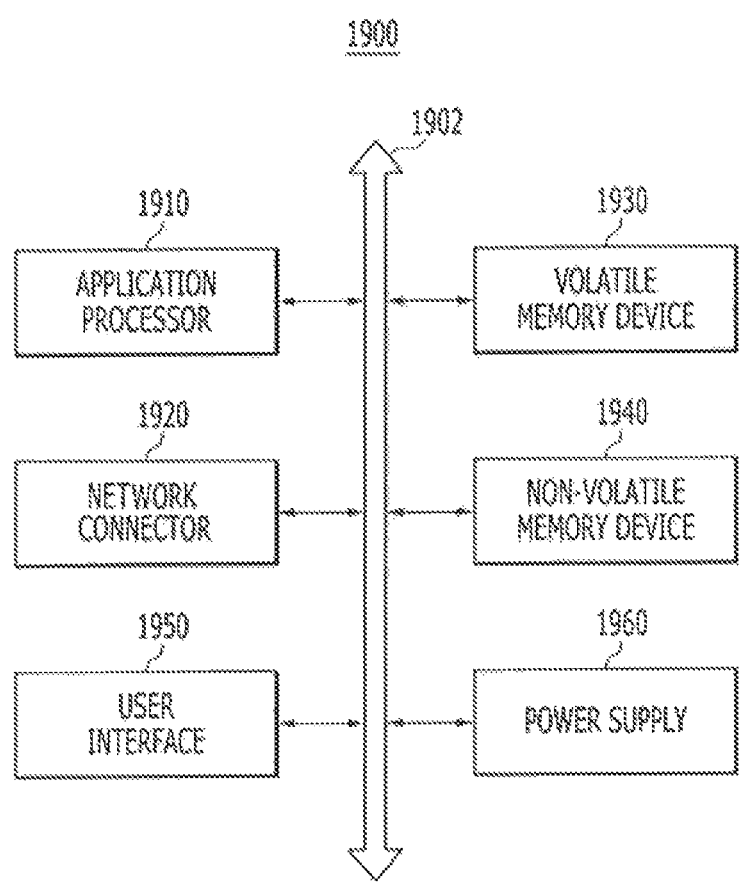
FIG. 12 is a block diagram of an example in which a memory device according to an exemplary embodiment is incorporated into a mobile system.

FIG. 12 is a block diagram of an example in which a memory device according to an exemplary embodiment is incorporated into a mobile system. Referring to FIG. 12, a mobile system 1900 according to an embodiment includes an application processor 1910, a network connector 1920, a first memory device 1930, a second memory device 1940, a user interface 1950 and a power supply 1960, which are connected to each other through a bus 1902. The first memory device 1930 is a volatile memory device and the second memory device 1940 is a non-volatile memory device.

According to embodiments, the application processor 1910 executes applications that provide, for example, Internet browsers, games, motion pictures, etc. According to the exemplary embodiment, the application processor 1910 further includes an external or internal cache memory.

According to embodiments, the network connector 1920 performs wireless communication or wireline communication with external devices.

According to embodiments, the first memory device 1930 is a volatile memory device that stores data processed by the application processor 1910 or operates as a working memory. The first memory device 1930 includes a plurality of memory cell rows, a temperature sensor that detects an internal temperature, and a mode register that stores an external temperature. The first memory device 1930 executes the input refresh commands by determining a ratio of the normal cell row refresh operation commands and the weak cell rows refresh operation commands based on the external temperature. Further, the first memory device 1930 may skip and execute some normal cell row refresh operation commands by comparing the internal temperature and the external temperature.

According to embodiments, the second memory device 1940 is a non-volatile memory device that stores a boot image for booting the mobile system 1900. The user interface 1950 includes one or more input devices, such as a keypad, a touch screen, or one or more output devices such as a speaker and a display device. The power supply 1960 supplies an operating voltage.

Figure 13:
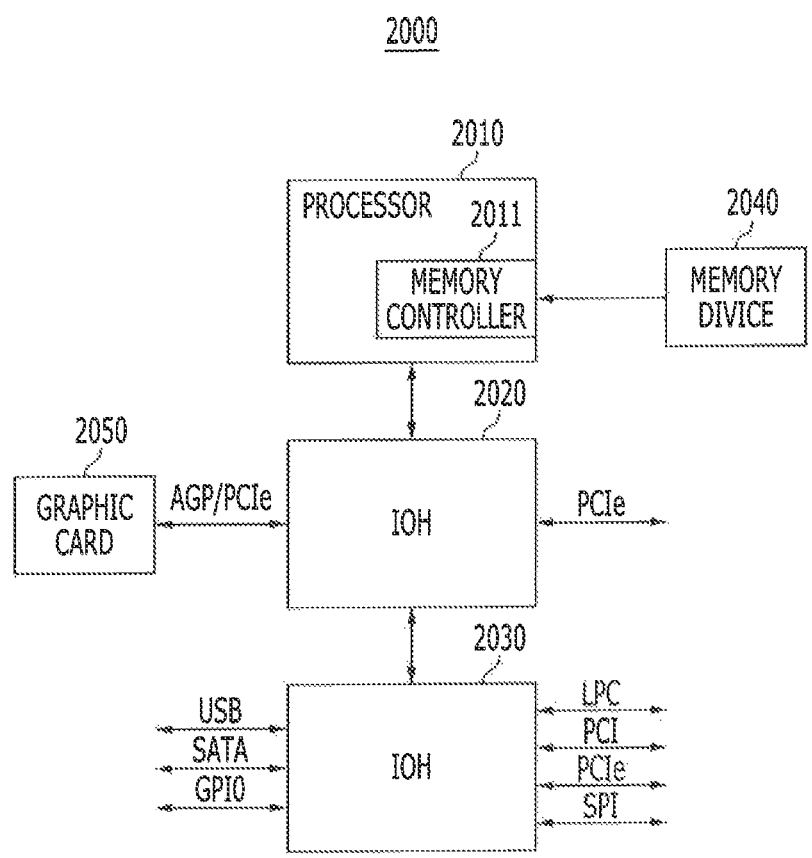
FIG. 13 is a block diagram of an example in which a memory device according to an exemplary embodiment is incorporated into a computing system.

FIG. 13 is a block diagram of an example in which a memory device according to an exemplary embodiment is incorporated into a computing system. Referring to FIG. 13, a computing system 2000 according to an embodiment includes a processor 2010, an I/O hub 2020, an I/O controller hub 2030, a memory device 2040 and a graphic card 2050.

According to embodiments, the processor 2010 can execute various computing functions such as specific calculations or tasks. The processor 2010 includes a memory controller 2011 that controls operations of the memory device 2040.

According to embodiments, the memory controller 2011 included in the processor 2010 is an integrated memory controller (IMC). According to an exemplary embodiment, the memory controller 2011 may be positioned in the I/O hub 2020. The I/O hub 2020 that includes the memory controller 2011 is referred to as a memory controller hub (MCH).

According to embodiments, the memory device 2040 includes a plurality of memory cell rows, a temperature sensor that detects an internal temperature, and a mode register that stores an external temperature. The memory device 2040 executes input refresh commands by determining a ratio between the normal cell row refresh operation commands and the weak cell rows refresh operation commands based on the external temperature. Further, the memory device 2040 skips and executes some of the normal cell row refresh operation commands by comparing the internal temperature and the external temperature.

According to embodiments, the I/O hub 2020 manages data transmission between devices such as the graphic card 2050 and the processor 2010.

According to embodiments, the graphic card 2050 is connected with the I/O hub 2020 through an accelerated graphics port (AGP) or a peripheral component interconnect express (PCIe). The graphic card 2050 controls a display device that displays an image.

According to embodiments, the I/O controller hub 2030 performs data buffering and interface mediation so that various system interfaces can efficiently operate. The I/O controller hub 2030 is connected with the I/O hub 2020 through an internal bus. The I/O controller hub 2030 provides various interfaces with peripheral devices.

According to the exemplary embodiment, two or more constituent elements of the processor 2010, the I/O hub 2020 or the I/O controller hub 2030 can be implemented by one chip set.

While embodiments of this disclosure has been described in connection with what is presently considered to be practical exemplary embodiments, it is to be understood that embodiments of the disclosure are not limited to the disclosed embodiments, but, on the contrary, are intended to cover various modifications and equivalent arrangements included within the spirit and scope of the appended claims.

What is claimed is:

1. A method of refreshing a memory device that includes a memory cell array that includes a plurality of memory cell rows, the method comprising:

storing external temperature data received from a memory controller;
determining a refresh period that corresponds to the external temperature data; and
outputting a plurality of memory cell row addresses or at least one weak cell row address of the plurality of memory cell row addresses based on a ratio that corresponds to the refresh period, in response to a refresh command received from the memory controller, wherein weak cell rows of the memory cell array have a shorter data retention time than normal cell rows of the memory cell array.

2. The refresh method of claim 1, wherein:
outputting the plurality of memory cell row addresses or at least one weak cell row address includes outputting the plurality of memory cell row addresses by increasing a ratio of outputting normal memory cell row addresses and weak memory cell row addresses, when the refresh period is decreased.

3. The refresh method of claim 1, further comprising:
detecting internal temperature data;
comparing the internal temperature data and the external temperature data; and
determining a skip ratio of the received refresh command based on the comparison result.

4. The refresh method of claim 3, wherein:
outputting the plurality of memory cell row addresses or the at least one weak cell row address includes skipping executing a refresh command for the plurality of memory cell row addresses based on the skip ratio.

5. The refresh method of claim 3, wherein:
determining the skip ratio of the input refresh command based on the comparison result includes
determining the skip degree to skip executing the received refresh command when the temperature section of the internal temperature data is in the temperature section of the external temperature data, and
determining the skip ratio so as to execute the received refresh command when the temperature section of the internal temperature data deviates from the temperature section of the external temperature data.

6. The refresh method of claim 1, further comprising:
receiving a mode register read command from the memory controller; and
transmitting output temperature data that increases the internal temperature data to the memory controller.

7. A memory device, comprising:
a memory cell array that includes a plurality of memory cell rows;
a temperature sensor that detects a temperature of the memory cell array and generates internal temperature data;
a first register that stores external temperature data received from outside the memory device; and
a refresh control unit that determines a skip ratio of refresh commands received at a refresh frequency that corresponds to the external temperature data by comparing the internal temperature data and the external temperature data and performing a refresh operation for the plurality of memory cell rows in response to refresh commands skipped and transmitted based on the skip ratio,
wherein the refresh control unit performs a refresh operation for at least one weak cell row of the plurality of memory cell rows in response to at least one first refresh command of the received refresh commands, wherein weak cell rows of the plurality of memory cell rows have a shorter data retention time than normal cells of the plurality of memory cell rows.

8. The memory device of claim 1, wherein:
the refresh control unit skips second refresh commands of the received refresh commands based on the skip ratio, except for at least one first refresh command of the received input refresh commands.

9. The memory device of claim 8, wherein:
the refresh control unit performs a refresh operation for at least one weak cell row by reducing a ratio of the first refresh commands to the second refresh commands when a refresh period is increased.

10. The memory device of claim 1, wherein:
the refresh control unit increases the skip ratio when a value of the internal temperature data is reduced while the value of the external temperature data remains constant.

11. The memory device of claim 1, wherein:
the temperature sensor generates a value that corresponds to a temperature section of a plurality of divided temperature sections that includes the temperature as the internal temperature data.

12. The memory device of claim 11, wherein:
the refresh control unit determines the skip ratio when the temperature section of the internal temperature data is in the temperature section of the external temperature data.

13. The memory device of claim 11, wherein:
the refresh control unit does not skip the input refresh command when the temperature section of the internal temperature data deviates from the temperature section of the external temperature data.

14. The memory device of claim 11, further comprising:
a second register that stores output temperature data that increases the value of the internal temperature data; and
a data pad that transmits the output temperature data out of the memory device.

15. The memory device of claim 14, wherein:
the output temperature data is transmitted through the data pad in response to a mode register read command received from outside the memory device and the external temperature data is received through the data pad in response to a mode register write command received from outside the memory device.

16. The memory device of claim 15, wherein:
the internal temperature data and the external temperature data each have a different number of bits and the external temperature data and the output temperature data have a same number of bits.

17. A memory system, comprising:
a plurality of memory devices, each including a memory cell array that includes a plurality of memory cell rows and a temperature sensor, wherein the temperature sensors of each of the plurality of memory devices generate a plurality of internal temperature data by detecting a temperature of the memory cell array of each of the plurality of memory devices; and
a memory controller that receives the internal temperature data from the plurality of memory devices and outputs a refresh command for refreshing the plurality of memory cell rows to the plurality of memory devices at a frequency that corresponds to a highest temperature of the plurality of internal temperature data,
wherein a refresh operation is performed for at least one weak cell row of the plurality of memory cell rows in response to at least one first refresh command of the outputted refresh commands, wherein weak cell rows of the plurality of memory cell rows have a shorter data retention time than normal cells of the plurality of memory cell rows.

18. The memory system of claim 17, wherein:
the memory controller outputs reference temperature data of the highest temperature of the internal temperature data to the plurality of memory devices, and
the plurality of memory devices selectively skip the refresh command based on a result of comparing the reference temperature data and the internal temperature data.

19. The memory system of claim 18, wherein:
at least one of the plurality of memory devices does not skip the refresh command.

* * * * *